(12) United States Patent
Mamiya et al.

(10) Patent No.: US 8,980,007 B2
(45) Date of Patent: Mar. 17, 2015

(54) THIN FILM FORMING APPARATUS AND THIN FILM FORMING METHOD

(75) Inventors: Chikao Mamiya, Tokyo (JP); Ichiro Kudo, Tokyo (JP); Masanobu Suzuki, Ibaraki (JP); Kiyoshi Oishi, Tokyo (JP); Daishi Yamashita, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 1510 days.

(21) Appl. No.: 12/305,662

(22) PCT Filed: Jun. 25, 2007

(86) PCT No.: PCT/JP2007/062701
§ 371 (c)(1),
(2), (4) Date: Dec. 19, 2008

(87) PCT Pub. No.: WO2008/001723
PCT Pub. Date: Jan. 3, 2008

(65) Prior Publication Data
US 2010/0159156 A1 Jun. 24, 2010

(30) Foreign Application Priority Data
Jun. 28, 2006 (JP) .................. 2006-177813

(51) Int. Cl.
| C23C 16/54 | (2006.01) |
| C23C 16/509 | (2006.01) |
| C23C 16/44 | (2006.01) |
| C23C 16/455 | (2006.01) |
| C23C 16/50 | (2006.01) |
| H05H 1/24 | (2006.01) |

(52) U.S. Cl.
CPC ........... *C23C 16/545* (2013.01); *C23C 16/4412* (2013.01); *C23C 16/455* (2013.01); *C23C 16/50* (2013.01); *H05H 1/24* (2013.01)
USPC ...................................... 118/718; 118/723 E (58) Field of Classification Search
USPC ................. 381/191, 423–426, 428–430, 432; 118/718
See application file for complete search history.

(56) References Cited

U.S. PATENT DOCUMENTS

| 3,959,567 A * | 5/1976 | Bradley ..................... 428/461 |
| 4,663,567 A * | 5/1987 | Wong ..................... 315/111.21 |
| 6,890,386 B2 * | 5/2005 | DeDontney et al. .......... 118/715 |

(Continued)

FOREIGN PATENT DOCUMENTS

| JP | 2001-279457 | 10/2001 |
| JP | 2003049273 | 2/2003 |

(Continued)

OTHER PUBLICATIONS

Japanese Office Action dated Aug. 18, 2011 (3 pages).

(Continued)

*Primary Examiner* — Karla Moore
(74) *Attorney, Agent, or Firm* — Lucas & Mercanti, LLP (57) ABSTRACT

Disclosed is a thin film forming apparatus which is a plasma discharge processing apparatus for performing a plasma discharge processing on the surface of a continuously transported base at or near atmospheric pressure, wherein a reverse flow of the processing gas is prevented and thus a thin film having good quality is formed by a uniform gas flow. The thin film forming apparatus is characterized by having an auxiliary gas discharge means for discharging an auxiliary gas for preventing a reverse flow of the processing gas. Also disclosed are a thin film forming method, and a thin film.

15 Claims, 1 Drawing Sheet

(56) References Cited

U.S. PATENT DOCUMENTS

2003/0113479 A1* 6/2003 Fukuda et al. .............. 427/569
2004/0247886 A1* 12/2004 Kudo et al. .................. 428/421

FOREIGN PATENT DOCUMENTS

| | | |
|---|---|---|
| JP | 2003049273 A * | 2/2003 |
| JP | 2003-093870 | 4/2003 |
| JP | 2003222723 | 8/2003 |
| JP | 2006028578 | 2/2006 |

OTHER PUBLICATIONS

English Translation of Japanese Office Action dated Aug. 18, 2011 (4 pages).

* cited by examiner

THIN FILM FORMING APPARATUS AND THIN FILM FORMING METHOD

This is a U.S. National Phase Application under 35 U.S.C. 371 of International Application PCT/JP2007/062701 filed on Jun. 25, 2007, which claims the priority of Japanese Application No. 2006-177813, filed Jun. 28, 2006, the entire content of both Applications are hereby incorporated by reference.

TECHNICAL FIELD

The present invention relates to a thin film forming apparatus and a thin film forming method.

TECHNICAL BACKGROUND

To provide the surface of substrates composed of plastic films with specific functions, as surface processing methods which laminate various kinds of thin films, employed have been a vacuum deposition method, a sputtering method, an ion beam method, and an ion plating method, as well as a plasma chemical vapor deposition (CVD) method utilizing glow discharge under reduced pressure. However, any of these methods are composed of vacuum based processing means, and pressure of processing systems is required to be significantly reduced. Consequently, an employed film forming apparatus becomes large scale instruments and units such as large processing chambers or large vacuum pumps which require complicated operations under high vacuum. Further, these instruments and units result in various types of restrictions and limitations such as sizes such as diameter and width of the wound roll of a substrate, capacity of thin film forming materials, or the like.

In order to overcome drawbacks of the surface processing methods composed of the above vacuum based processing means, thin film formation, via a normal pressure plasma CVD method, has been tried. In an apparatus which is employed for continuous surface processing or continuous film formation employing the above normal pressure plasma, in order to minimize point discharge, employed is a pair of parallel plate electrodes rimming the periphery with a smooth curved surface.

The above parallel plate electrodes are easily prepared, while the distance between them is easily arranged. Further, a large electrode area is usable. Consequently, a film to be processed, which is conveyed between the electrodes, is sequentially processed, whereby it is possible to enhance the film forming rate, and in addition, compared to the above-mentioned low pressure plasma, it is possible to increase the density of the plasma processing gasses, resulting in a method of excellent processing efficiency. However, from another aspect, installation cost such as electrodes is high and reduction of equipment cost or cost reduction via an increase in processing capacity are keys for practical application. In order to increase the above processing capacity, it is possible to consider an increase in energy such as an increase in plasma density or an increase in electric field intensity. However, when the electric field intensity is increased, concentrated discharge of large electric current may occur due to arc.

Further, since the above electrodes are fixed, they are always exposed to a flow of a gas mixture for film formation and plasma discharge is continued, the surface of the above electrodes is gradually stained, and finally, the discharge state is adversely affected to result in fluctuation of performance of the formed film and processing surface. In a marked case, problems occur in which clearly visible defects such as streaking or mottling are generated.

In order to minimize staining of the above electrodes, a discharge plasma processing system is proposed in which a gas mixture is fed between the plasma processing electrodes, each of which is in the shape of a roller (refer, for example, to Patent Document 1). However, it is difficult to uniformly introduce a processing gas between the roller electrodes which face each other. Namely, due to gas leakage (counter flow) from the gap between the gas feeding nozzle and the roller electrode, and direct adhesion of retained components on the substrate prior to conveyance to a discharge space between the feeding exit and the discharge space, targeted film quality has not been realized.

As means to minimize the gas leakage, for example, Patent Document 2 describes installation of a skirt which minimizes leakage of introduced gasses. However, no technical disclosure is made to overcome drawbacks such as formation of retained components between the feeding exit and the discharge space, and direct adhesion of raw materials onto a substrate prior to introduction to the discharge space.

Patent Document 1: Japanese Patent Publication Open to Public Inspection (hereinafter referred to as JP-A) No. 2003-93870

Patent Document 2: JP-A No. 2001-279457

DISCLOSURE OF THE INVENTION

Problem to be Dissolved by the Invention

In view of the foregoing, the present invention was achieved. An object of the present invention is to provide a thin film forming apparatus capable of forming a thin film exhibiting desired film quality when film is prepared via a discharge plasma processing system, and a thin film forming method.

Means to Solve the Problems

The above object of the present invention was achieved via the following embodiments.

1. In a thin film forming apparatus in which a thin film is formed on the surface of a continuously conveyed substrate via plasma discharge processing at or near atmospheric pressure, a thin film forming apparatus which contains:

a pair of rotating roller electrodes which face each other beyond the specified gap, a plasma discharge means which applies voltage to the pair of roller electrodes to generate plasma discharge, a conveying means which conveys the substrate to the plasma discharge means, a processing gas blowing means which carries a processing gas blowing exit section which blows a processing gas at or near atmospheric pressure to the substrate passing the plasma discharge means in the direction of the specified gap, a complementary gas blowing exit section which is arranged in the processing gas blowing means and blows complementary gas containing an inert gas, and a gas exhaust means which exhausts the processing gas and the complementary gas which have passed the plasma discharge means.

2. The thin film forming apparatus, described in 1., wherein the complementary gas blowing exit section is arranged in the rotation axis direction to face each of the surfaces of the paired roller electrodes so that at least one part of each of the complementary gasses blown from the complementary gas blowing exit section flows in the same direction as that of the flow of the processing gas blown from the processing gas blowing exit section.

3. The thin film forming apparatus, described in 1, or 2., wherein angle θ of the direction of the complementary gas which is blown towards one of the paired roller electrodes to the direction of the processing gas which is blown in the direction toward the specified gap, is 0°≤θ<90°.

4. The thin film forming apparatus, described in any of 1.-3., wherein the processing gas contains at least 90% by volume of, inert gas and oxygen, or hydrogen.

5. The thin film forming apparatus, described in 1. or 4., wherein the inert gas is a rare gas or nitrogen.

6. The thin film forming apparatus, described in any of 1.-3., wherein the surface of one of the paired roller electrodes is covered with a solid dielectric.

7. The thin film forming apparatus, described in any of 1.-6., wherein the distance between each of the complementary gas blowing exit section and the surface of the paired roller electrodes is 0.5-20 mm.

8. The thin film forming apparatus, described in any of 1.-7., wherein a distance of the specified gap is 0.5-20 mm.

9. The thin film forming apparatus, described in 1., wherein frequency of a power source which applies voltage to the paired roller electrodes is more than 80 kHz and not more than 150 MHz.

10. The thin film forming apparatus, described in any of 1.-9., wherein the paired roller electrodes, the plasma discharge means, the conveying means, the processing gas blowing means, and the gas exhaust means are incorporated within one processing chamber.

11. In a thin film forming method in which a thin film is formed on a surface of a continuously conveyed substrate via plasma discharge processing at or near atmospheric pressure, a thin film forming method which contains:
a pair of rotating roller electrodes which face each other beyond a specified distance,
a plasma discharge process which applies voltage to the paired roller electrodes to result in plasma discharge,
a conveying process which conveys the substrate to the plasma discharge means,
a processing gas discharging process which carries a processing gas discharging exit section which blows a processing gas at or near atmospheric pressure to the substrate passing the plasma discharge process in the direction of the specified gap,
a complementary gas blowing exit section which is arranged in the processing gas blowing process and blows complementary gas containing inert gas, and
a gas exhaust process which exhausts the processing gas and the complementary gas which have passed the plasma discharge process.

12. The thin film forming method, described in 11., wherein the processing gas contains inert gas at 90-99.99% by volume and reactive gas at 0.01-10% by volume.

13. The thin film forming method, described in 11. or 12., wherein the processing gas contains gaseous organic metallic compounds or gaseous organic fluorine compounds.

Advantage of the Invention

In the present invention, since provided is a complementary gas blowing means, which blows complementary gas which restrains reverse flow and retention of the processing gas, is provided, it is possible to prepare a thin film exhibiting excellent film quality.

DESCRIPTION OF ALPHANUMERIC SYMBOLS

F: Substrate
G. Processing gas
G': Gas after processing
CG: Complementary gas
10A and 10B: Roller electrodes
11A, 11B, 11C, and 11D: Returning rollers (U-turn roller)
20 and 21: Guide rollers
30: Processing gas blowing means
40: Gas exhaust outlet
80: Power source
81 and 82: Voltage feeding means
100: Discharge section

BEST EMBODIMENT TO PRACTICE THE INVENTION

The present invention will now be detailed.
(Plasma Discharge Processing Apparatus)

The apparatuses of the present invention, which carry out plasma discharge processing under an atmospheric pressure or a pressure near the same, are exemplified via drawings and described, however the plasma discharge processing apparatuses of the present invention are not limited thereto.

Figure 1:
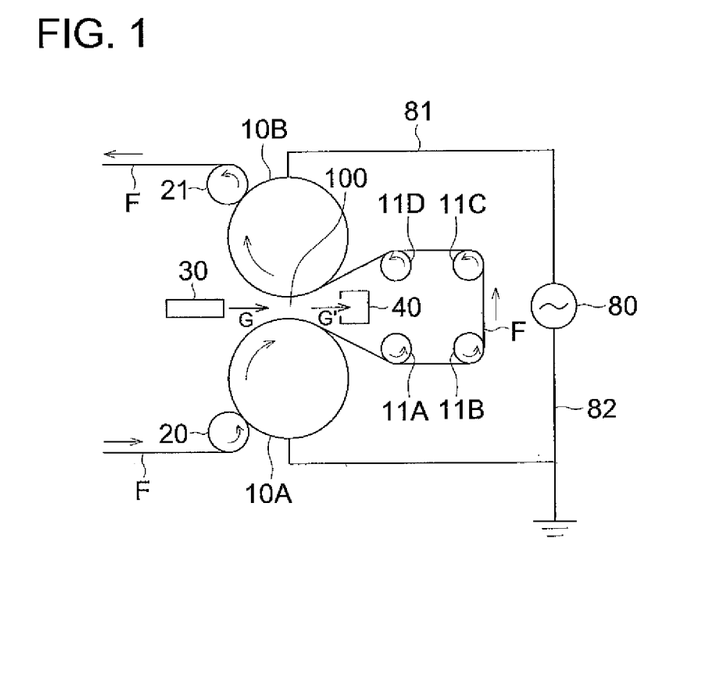
FIG. 1 is a schematic view of a plasma discharge processing apparatus in which processing is carried out by reciprocating a substrate while employing roller electrodes.

FIG. 1 is one example of a plasma discharge processing apparatus employed in the manufacturing method of the present invention. FIG. 1 is a schematic view of a plasma discharge processing apparatus in which processing is carried out via reciprocating a substrate while employing roller electrodes. The above apparatus contains a pair of roller electrode 10A and roller electrode 103, and these roller electrodes 10A and 10B are connected, via voltage feeding means 81 and 82, to power source 80 capable of carrying out voltage applications for plasma discharge.

Roller electrodes 10A and 10B are rotating electrodes which are rotatable while conveying substrate F via partial winding. Discharge section 100 is maintained under an atmospheric pressure or a pressure near the same, and processing gas G is fed from processing gas feeding section 3, whereby plasma discharge is carried out in discharge section 100. Substrate F fed from the pre-process or the master roll is brought into close contact with electrode 10A via guide roller 20, is synchronously subjected to rotational transportation, and is subjected to plasma discharge processing via processing gas under an atmospheric pressure of a pressure near the same. Processing gas feeding section is preferably in a slit shape with a width which is the same as that of the substrate or is slightly wider than the same. Alternatively, gas outlets in a pipe shape may be lined up in the sideway so that the resulting width is the same as that of the substrate. It is preferable that processing gas G is introduced into discharge section 100 at a uniform flow amount or flow rte totally in the lateral direction. Once processed substrate F passes through returning rollers (also called U turn rollers) 11A, 11B, 11C, and 11D, is conveyed in the reverse direction, is wound by roller electrode 10B, and is again subjected to a plasma discharge processing in discharge section 100, and is conveyed via guide roller 21 to a winding process or the following process (each of them is not shown). Gas G' after processing is exhausted from exhaust outlet 40. It is preferable that the exhaust gas rate from exhaust outlet 40 is identical to or is slightly greater then the flow rate from processing gas feeding section 30. The surface side of roller electrodes 10A and 105 of discharge section 100 may be blocked off or the whole may be filled via rare gas, nitrogen gas, or processing gas G.

(Processing Gas Blowing Means)

Processing gas blowing means 30 will now be described. Processing gas G is blown in the direction of the gap between roller electrodes 10A and 10B. At that time, when the gap between the electrode rollers is narrow, it is not possible for the whole gas to pass through the gap, and some leaks from the gap between processing gas feeding means 30 and the electrode to result in blowing to the exterior, whereby extra processing gas is needed to compensate the leaked gas, and the interior of the processing chamber is further filled. Further, it is concerned that human body is adversely affected, depending on the kind of processing gasses.

In order to overcome the above drawbacks, in the embodiment of the present invention, as a means to block leaked processing gasses, a blowing exit is arranged in processing gas blowing means 30 so that complementary gas CG is blown in the approximately same direction as that of the processing gas.

Processing gas G, as described herein, is composed of discharge gasses and thin film forming gasses. Further, the discharge gasses are inert gasses such as rare gasses or nitrogen, while the thin film forming gasses are composed of raw material gasses which become raw materials of a deposited film and reaction gasses which enhance decomposition. Further, complementary gas CG is composed of inert gasses such as rare gasses or nitrogen, or inert gasses such as nitrogen and reaction gasses which enhance decomposition, and does not include raw material gasses which become raw materials of film. It is preferable that complimentary gas CG has the same composition as that of the discharge gas in the processing gas, or has the same composition of the discharge gas and the reaction gas.

Further, the flow rate of the complimentary gas during its blowing is preferably at least the same as that of the processing gas during blowing from the blowing section of the processing gas blowing means to at most 5 times. When the flow rate is less than the above, effects of the complementary gas become small, when while it is at least 5 times, it becomes difficult to feed the processing gas into a discharge space.

Figure 2:
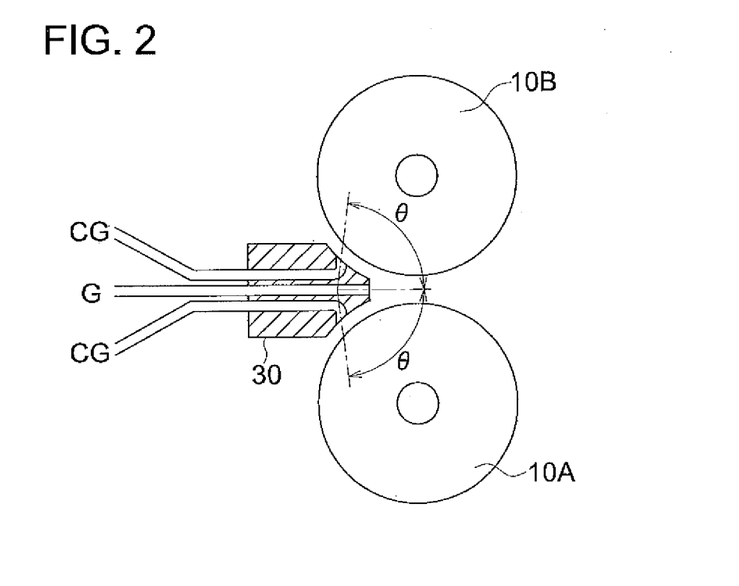
FIG. 2 is a view showing the angle of a processing gas blowing direction to a complementary gas blowing direction.

Still further, by arranging angle θ (refer to FIG. 2) of the direction during blowing of complementary gas CG to the roller electrode to the blowing direction of processing gas G which blows to the direction of the specified gap where a pair of roller electrodes face with each other so that 0≤θ<60° is held, it is possible to minimize contamination of processing gas G to the gap region between the complementary gas blowing exit section and the surface of the roller electrode. Further, it was possible to experimentally obtain that 0≤θ<30° was more preferred. The reason is that when θ exceeds 90°, the component of complementary gas CG directed to the discharge space decreases, whereby it becomes not possible to obtain the effects of the present invention.

With regard to complementary gas CG, it is preferable that in the same as the processing gas feeding section, a slit shape is preferred which exhibits the same width as that of the substrate or slightly greater than that. Alternatively, an arrangement may be employed in which blowing exits in a pipe shape is lined alongside so that the width is the same as that of the substrate. It is preferred that blowing is totally carried out at a uniform flow volume or a flow rate in the lateral direction.

Materials of processing gas blowing means 30, which blows processing gas G and complementary gas CG are preferably ceramics such as alumina, and insulating materials such as resins. Of these, specifically preferred are heat resistant resins such as PEEK (polyether ketone).

(Roller Electrodes)

Roller electrodes employed in the present embodiment will now be described. Roller electrodes are composed of conductive parent materials such as metals, and their surface is preferably covered with solid dielectrics. As solid dielectrics, listed may be plastics such as polytetrafluoroethylene or polyethylene terephthalate; glass; metal oxides such as silicon dioxide, aluminum oxide, zirconium oxide, or titanium oxide; or composite metal oxides such as barium titanate. Specifically preferred are ceramic cover processed dielectrics which have been subjected to a sealing process employing inorganic materials after thermal spraying ceramics. Further, listed as conductive parent materials such as electrode metals may be metals such as silver, platinum, stainless steel, aluminum, or iron. Of these, in view of processing, preferred is stainless steel. Further, preferred as lining materials are silicate based glass, borate based glass, phosphate based glass, germinate based glass, telluride glass, aluminate glass, and vanadate glass. Of these, in view of easier processing, preferably employed is borate based glass.

It is desirable that if needed, electrodes employed in the present embodiment are subjected to temperature regulation such as heating or cooling. For example, by supplying liquid in the interior of a roller, the temperature of the electrode surface and the substrate is controlled. As liquid to control the temperature, insulating materials such as distilled water or oil are preferred. Temperature of substrates varies depending on processing conditions. It is preferable to set at from room temperature to 200° C., but is more preferably to set at from room temperature to 120° C.

Since the surface of the roller electrodes is brought into close contact with the substrate, and the substrate and the electrode are synchronously conveyed and rotated, high smoothness is required. Smoothness is designated as maximum height (Rmax) of the surface roughness and center line mean surface roughness (Ra) specified in JIS B 0601. Surface roughness Rmax of a belt type electrode or a roller type electrode employed in the present embodiments is preferably at most 10 μm, is more preferably at most 8 μm, but is most preferably at most 7 μm. Further, Ra is preferably at most 0.5 μm, but is more preferably at most 0.1 μm.

In the present embodiment, the specified gap where paired roller electrodes face each other is determined upon considering the thickness of the solid dielectrics, the magnitude of applied voltage, the purpose to utilize plasma, and shape of the electrodes. In view of uniform generation of plasma discharge, the distance between the electrode surfaces is preferably 0.5-20 mm, is more preferably 0.5-5 mm, but is most preferably 1 mm±0.5 mm. "Specified gap" in the present embodiment refers to the gap where the surfaces of facing electrodes are nearest. Further, in the case of roller electrodes, it is preferable that the resulting gap remains constant during rotation of the roller electrodes. Specifically, during one rotation of the roller, fluctuation of the specified gap is preferably less than ±10%, is more preferably ±3%, but is most preferably ±0. Fluctuation in the lateral direction of the substrate which passes through the specified gap is the same as above. The diameter of the roller electrode is preferably 10-1,000 mm, is more preferably 20-500 mm, but is most preferably 30-300 mm. Further, the peripheral rate of the roller electrode is preferably 1-100 m/minute, but is more preferably 10-50 m/minute.

In the present embodiment, it is preferable that a processing chamber, which contains a pair of roller electrodes, a plasma discharge means, a processing gas blowing means, and a gas exhaust means, is surrounded by a frame or vessel of materials of the electrode and insulating materials. When insulation from the electrodes is assured, those made of metals may be employed. For example, those made of metals include aluminum or stainless steel frames in which polyimide resins are adhered via ceramic spraying onto their interior surface and aforesaid metal frames to result in insulation. Further it is preferable that the entire apparatus is surrounded by a processing vessel made of PYREX (registered trade name) glass. Other than the outside surrounding described as above, it is preferable to locally surround the side surface of the discharge section, the electrodes, or substrate conveying means to enable appropriate supply of the processing gas to the discharge section and exhaustion of the exhaust gas, whereby it is possible to make the gas concentration and composition constant and to stably carry out the plasma discharge processing.

Voltage applying means to generate plasma discharge in the present invention are not particularly limited. One method is as follows. A power source is connected to one of facing electrodes while the other electrode is grounded. A high frequency power source is preferably employed as a power source of the present invention. Further, a pulsed power source is usable. The value of voltage applied to the electrode from the power source is appropriately determined. For example, the voltage is preferably about 0.5-about 10 kV. Frequency of the power source is regulated to 1 kHz-150 MHz. The frequency is preferably 100 kHz-13.56 MHz, since a thin uniform film is prepared due to stable discharge. The waveform may be either a pulse wave or a sine wave.

Further as another embodiment, as described in JP-A No. 2004-189958, plasma discharge may be generated via application of high frequency voltage to each of the facing roller electrodes.

(Processing Gas)

Processing gas employed in the plasma discharge processing apparatus of the embodiment of the present invention will now be described.

In the present embodiments, it is specifically preferable to employ, as processing gas, a mixed discharge gas composed mainly of rare gasses or nitrogen and reactive gasses.

As rare gas elements which are useful in the present embodiment, listed may be Group 18 elements in the periodic table, specifically helium, neon, argon, krypton, and radon. In the present embodiments, helium and argon are more preferred, and of these two, argon is most preferred. In order to achieve stable plasma generation, the concentration of rare gas or nitrogen in the processing gas is preferably at least 90% by volume, but is most preferably 90-99.99% by volume. The discharge gas is necessary to generate a plasma, and the reactive gas during the above plasma discharge is ionized or radicalized contribute to the surface processing.

In the present embodiment, as the reactive gas, employed are various substances depending on the type of thin functional films prepared on the substrate. For example, by employing organic fluorine compounds as the above reactive gas, it is possible to prepare a low refractive index layer which is useful for an antireflection layer and an antistaining layer, while by employing silicon compounds, it is possible to prepare a low refractive index layer which is useful as an antireflection layer. Further, by employing organic metallic compounds incorporating metal such as Ti, Zr, Sn, Si, or Zn, it is possible to prepare a metal oxide layer or a metal nitride layer. By employing these, it is possible to prepare a medium refractive index layer and a high refractive index layer which are useful as an antireflection layer. Further, it is possible to form a conductive layer and an antistatic layer.

As described above, as useful reactive gas substances, listed may be organic fluorine compounds and metallic compounds.

As organic fluorine compounds, which are reactive gasses which are preferably employed in the present embodiment, listed may be fluorinated hydrocarbon compounds such as tetrafluoromethane, hexafluoroethane, 1,1,2,2-tetrafluoroethylene, 1,1,1,2,3,3-hexafluoropropane, or hexafluoropropene, however the compounds are not limited thereto. It is preferable to select compounds which generate neither corrosive nor toxic gasses via plasma discharge processing of the above organic fluorine compounds. On the other hand, it is possible to select conditions which result in no formation of the above gasses. When organic fluorine compounds are employed as a useful reactive gas in the present embodiment, it is preferable that organic fluorine compounds are gaseous at normal temperature and normal pressure, since it is possible to employ them as an optimal reactive gas component to realize the target without any modification. Contrary to the above, in the case in which organic fluorine compounds are liquid or solid at normal temperature and normal reassure, they may be employed upon being vaporized via such means as a vaporizing apparatus. Further, they may be dissolved in appropriate solvents followed by spraying or evaporation.

When the above organic fluorine compounds are employed in the processing gas, in view of formation of a thin uniform film, the content of the organic fluorine compounds in the processing gas is preferably 0.01-10% by volume, but is more preferably 0.1-5% by volume. They may be employed individually or as a mixture.

Further, as metallic compounds of reactive gasses which are preferably employed in the present embodiment, listed may be metallic compounds of Al, As, Au, B, Si, Ca, Cd, Cr, Co, Cu, Fe, Ca, Ge, Hg, In, Li, Mg, Mn, Mo, Na, Ni, Pb, Pt, Rh, Sb, Se, Si, Sn, V, W, Y, Zn, or Zr, as well as organic metallic compounds thereof.

Of these, examples of silicon compounds include alkylsilanes such as dimethylsilane or tetramethylsilane; silicon alkoxides such as tetramethoxysilane, tetraethoxysilane, tetrapropoxysilane, dimethylethoxysilane, methyltrimethoxysilane, or ethyltriethoxysilane; silicon-hydrogen compounds such as monosilane or disilane; halogenated silicon compounds such as dichlorosilane, trichlorosilane, or tetrachlorosilane; and other organosilanes, and any of these may be preferably employed. In the present embodiment, these are not limited thereto. Further, these may be employed in appropriate combinations. In view of handling, the above silicon compounds are preferably silicon alkoxides, alkylsilanes, and organic silicon hydrogen compounds. Due to neither corrosiveness nor generation of toxic gasses and minimal staining of processing, silicon alkoxides are specifically preferred as organic silicon compounds.

Metallic compounds other than silicon, as a useful reactive gas in the present invention, are not particularly limited, and listed may be organic metallic compounds, halogenated metallic compounds, as well as metal-hydrogen compounds. As an organic component of organic metallic compounds, preferably are an alkyl group, an alkoxide group, and an amino group, and preferably listed are tetraethoxy titanium, tetraisopropoxy titanium, tetrabutoxy titanium, and tetradimethylamino titanium. Further, listed as halogenated metallic compounds may be titanium dichloride, titanium trichloride, and titanium tetrachloride, while listed as metal-hydrogen compounds may be monotitanium and dititanium. In the present embodiment, preferably employed may be titanium based organic metallic compounds.

In order to introduce the above organic metallic compounds into the discharge section, a gas, liquid, or solid state may be employed. When the above compounds are in a liquid or solid state, they may be employed upon being vaporized via a vaporizing apparatus employing heat, reduced pressure, or ultrasonic waves. In the present embodiment, it is preferable to employ them upon being gasified or vaporized. Since liquid organic metallic compounds of a boiling point of at most 200° C. at normal temperature and normal pressure are easily vaporized, they are appropriate to manufacture the thin film of the present embodiment. Further, when organic metallic compounds are metallic alkoxides such as tetraethoxysilane or tetraisopropoxy titanium, they are easily dissolved in organic solvents, whereby they may be employed upon being diluted via organic solvents such as methanol, ethanol, or n-hexane. The organic solvent may be as a mixed solvent.

In the present embodiment, when organic metallic compounds are applied to processing gas as a reactive gas, the content in the processing gas is preferably 0.01-10% by volume, but is more preferably 0.1-5% by volume. The metallic compounds may be employed individually or in combinations of several types.

Hydrogen, oxygen, nitrogen, nitrogen monoxide, nitrogen dioxide, carbon dioxide, ozone, and hydrogen peroxide may be mixed with organic fluorine compounds and organic metallic compounds, as described above, or reactive gas of any of them in an amount of 0.1-10% by volume with respect to the rare gas. As noted previously, via supplementary employment, it is possible to significantly enhance the hardness of a thin film.

When a substrate of the present embodiment contains an antireflection layer, for example, organic silicon compounds are suitable to form a low refractive index layer, while titanium based organic metallic compounds are suitable to form as a high refractive index layer. Any of these are preferably employed. Further, a gas mixture composed of these gasses may be employed. By regulating the mixing ratio, it is possible to control the resulting refractive index, whereby it is possible to form a medium refractive index layer.

It is assumed that a low refractive index layer and a high refractive index layer formed, via a plasma discharge process by employing the above processing gas, is primarily composed of metal oxides, even though it is not totally composed of them. For example, it is preferable that in a laminated composition which contains a high refractive index layer composed of organic silicon compounds and a low refractive index layer composed of organic titanium compounds, the low refractive index layer contains silicon oxide as its major component and the high refractive index layer contains titanium oxide as its major component. At that time, a minute amount of silicon oxide may be mixed in the high refractive index layer composed of titanium oxide as its major component, while a minute amount of titanium oxide may be mixed in the low refractive index layer composed of silicon oxide as its major component. When mixed as described above, it is possible to improve close contact properties (adhesion properties). In order to regulate refractive index to satisfy targeted or other purposes, obviously, it is possible to add, to a processing gas, organic metallic compounds or fluorine-containing compounds other than the major component. It is preferable that in a pre-stage of feeding a processing gas from the processing gas feeding section, appropriate blending is carried out. As noted above, the discharge section is filled with the processing gas. Accordingly, even though accompanied air is slightly introduced, into the processing chamber, effects due to the minute amount of air (oxygen and nitrogen) or moisture may be ignored. Depending on processing conditions, a process is carried out in such a manner that air (oxygen and nitrogen) and moisture are intentionally added.

(Substrates)

Substrates according to the present embodiment will now be described.

As substrates according to the present embodiment, listed may be cellulose ester films, polyester films, polycarbonate films, polystyrene films, polyolefin films, polyvinyl alcohol based films, cellulose based films, and other resin films. As examples of the cellulose ester films, listed may be cellulose diacetate films, cellulose acetate butyrate films, cellulose acetate propionate films, cellulose acetate phthalate films, cellulose triacetate, and cellulose nitrate; as polyester films, listed may be polyethylene terephthalate films, polyethylene naphthalate films, polybutylene naphthalate films, 1,4-dimethylenecyclohexylene terephthalate, or copolyester films of structural units thereof; as polycarbonate films, listed may be polycarbonate films of bisphenol A; as polystyrene films, listed may be cyndioctatic polystyrene films; as polyolefin films, listed may be polyethylene films and polypropylene films; as polyvinyl alcohol based films, listed may be polyvinyl alcohol films and ethylene vinyl alcohol films; as cellulose based films, listed may be cellophane; and as other resin films, listed may be norbornene resin based films, polymethylpentene films, polyether ketone films, polyimide films, polyethersulfone films, polysulfone based films, polyether ketoneimide films, polyamide films, fluororesin films, nylon films, polymethyl methacrylate films, acryl films or polyacrylate films, and polyvinylidene chloride films.

It is possible to preferably employ a film which is prepared by appropriately blending the above film components. For example, it is possible to employ a film which is prepared by blending commercial resins such as ZEONEX (produced by Nippon Zeon Co., Ltd.) and ARTON (produced by JSR Corp.). Further, even though components are employed which inherently exhibit a high double refractive index, it is possible to prepare a material which is suitable for the present embodiment by appropriately setting conditions such as solution casting or melt casting, and further to set conditions to stretch in the longitudinal and lateral directions. The present embodiment is not limited to the above-mentioned films.

Thickness of employed substrates which are suitable for the plasma discharge process of the present embodiment is preferably 10-1,000 μm, is more preferably 10-200 μm, but is most preferably 10-60 μm.

(Thin Film, Layer Laminated Composition, and Film)

In the present embodiment, a thin film is formed in such a manner that a substrate is subjected to plasma discharge processing in the discharge section between the facing electrodes at or near atmospheric pressure. In the present embodiment, it is possible to apply the plasma discharge processing at or near atmospheric pressure to a substrate of a width as much as 2,000 mm. Further, it is possible to achieve a processing rate of 100 m/minute. In the present embodiment, it is preferable that when plasma discharge is initiated, firstly upon sucking air from the processing chamber via a vacuum pump, processing gasses or rare gasses are introduced into the processing chamber and the processing gas is fed to fill the discharge section. Then, the substrate is transferred, followed by further processing.

It is possible to appropriately regulate the film thickness via the discharge section, the processing gas concentration, and the substrate conveying rate.

Plasma discharge processing of the present embodiment forms a thin film only on one side of the substrate. After winding, the resulting substrate may be passed through an apparatus to apply plasma discharge processing onto the opposite side. When an antistatic layer is formed via metal oxides, the antistatic layer or a conductive layer may be formed by applying a liquid coating composition incorporating minute metal oxide particles and crosslinking cationic polymer particles onto a substrate to form a film of a thickness of about 0.1-about 2 μm. However, it is possible to form a thin conductive layer via the plasma discharge processing of the present embodiment. For example, conductive layer of metal oxides such as tin oxide, indium oxide, or zinc oxide may be formed. It is possible to practice the easy adhesion process described in Japanese Patent Application No. 2000-273066, and the antistatic process described in Japanese Patent Application No. 2000-80043 by employing the plasma discharge processing of the present embodiment.

Thin film forming conditions employing the plasma discharge processing method of the present embodiment are described in the above plasma discharge processing apparatus. Further, described are other conditions to carry out the processing.

When the thin film of the present embodiment is formed, it is easier to form a thin uniform film by applying the plasma discharge process to a substrate which have been subjected to a thermal treatment at 50-120° C., whereby pre-heating is a preferable method. It is possible to dry a substrate which has absorbed moisture, and it is preferable to apply the plasma discharge process to the substrate maintained at low humidity. It is preferable to apply the plasma discharge process to a substrate which has been rehumidified at a relative humidity of preferably less than 60% but more preferably 40%, followed by no absorption of moisture. The moisture content is preferably at most 3%, is more preferably at most 2%, but is most preferably at most 1%.

Further, an effective means is that a substrate after the plasma discharge process is subjected to thermal treatment for 1-30 minutes in a thermal treatment zone at 50-130° C., whereby it is possible to stabilize the thin film.

Further, when a laminated layer composition is prepared via the multistage plasmas discharge process of the present embodiment, ultraviolet radiation may be exposed to a processing surface prior to and after each plasma discharge process, whereby it is possible to improve close contact (adhesion properties) of a formed thin film onto the substrate and the resulting stability. The exposure amount of the ultraviolet radiation is preferably 50-2,000 mJ/cm$^2$. When it is less than 50 mJ/cm$^2$, no sufficient effects are realized, while when it exceeds 2,000 mJ/cm$^2$, a concern is that modification of the substrate may result.

Thickness of the thin film formed in the present embodiment is preferably in the range of 1-1,000 nm.

The film thickness deviation with respect to the average film thickness of the thin film formed by the plasma discharge process of the present embodiment is relatively small to enable the formation of a uniform thin film, whereby it is an excellent thin film forming method. It is possible to prepare a thin film of a film thickness deviation within ±10%, preferably within ±5%, but ±1%.

The above liquid coating composition incorporating minute inorganic or organic particles is applied onto a substrate followed by drying, whereby it is possible to form a uniformly thick thin layer via the plasma discharge process on a functional layer exhibiting surface roughness Ra of 0.1-0.5 μm, such as an antiglare layer. For example, when the resulting thin film is a low refractive index layer or a high refractive index layer, it is possible to arrange it as an optical diffraction layer.

The film of the present embodiment is composed of thin films formed via the plasma discharge process of the present embodiment and a laminated layer composition thereof.

Films of the present embodiment include, but are not limited to, an antireflection film, an antiglare antireflection film, an electromagnetic wave shielding film, an electrically conductive film, an antistatic film, a retardation film, an optical compensation film, an enlarged view angle film, and a luminance enhancing film.

EXAMPLES

The present invention will now be described with specific reference to examples, however the present invention is not limited thereto.

<<Evaluation>>
<Evaluation of Abrasion Resistance>

The surface (being the side coated with the antistaining layer) of each optical film prepared by employing the thin film forming apparatus of the present invention, which utilizes complementary gas CG, was subjected to 10 rubbing treatments via steel wool (BONSTAR #0000), employing a rubbing tester HEIDON-14DR under conditions of a load of 40 kPa and a movement rate of 10 mm/minute. Thereafter, a 10 mm×10 mm area was observed via a magnifying glass, and abrasion resistance was evaluated based on the following criteria:

A: no abrasion was noted
B: the number of noted abrasion lines was 1-5
C: the number of noted abrasion lines was 6-15
D: the number of noted abrasion lines was 16-25
E: the number of noted abrasion lines was at least 26

An evaluation of A or B was judged to be commercially viable in terms of abrasion resistance.

<Evaluation of Visual Non-Uniformity>

The rear surface of a sample of the total width by the longitudinal of 500 mm was subjected to a light absorption treatment employing a black spray, and reflected light of a fluorescent lamp from the surface was observed, whereby non-uniformity of the reflected light was evaluated.

A: non-uniformity was not noted
B: slight non-uniformity was noted
C: obvious non-uniformity was noted
D: significant non-uniformity was noted <Haze>

Haze was determined based on ASTM-D1003-52.

<<Substrate Film>>

Polyethylene terephthalate film (PET) at a substrate thickness of 128 μm was employed.

<<Film Forming Conditions>>

<Processing Gas 1>

| | |
|---|---|
| Discharge gas: argon | 94.9% by volume |
| Thin film forming gas: raw material gas: tetraethoxysilane (vaporized via the vaporizer produced by Lintec Corp, upon being mixed with nitrogen gas) | 0.1% by volume |
| Reaction gas: oxygen gas | 5.0% by volume |

-continued

| <Processing Gas 2> | |
|---|---|
| Discharge gas: argon gas | 97.9% by volume |
| Thin film forming gas: tetraisopropoxy titanium | 0.1% by volume |
| Added gas: hydrogen | 2.0% by volume |
| <Complimentary gas>: | |
| argon gas | 100% by volume |

<Power Source Condition>
Frequency 13.56 MHz
<Roller Electrode>
  Roller diameter: φ300 mm
  Covered with a 1 mm alumina spray dielectric
<Discharge Gap>
  1 mm
<Gap Between Nozzle Side Surface and Roller Electrode>
  0.5 mm Comparative Example In the case of the absence of a complementary gas, evaluation was carried out employing Processing Gasses 1 and 2.

Table 1 shows the results of experiments carried out under the above conditions.

TABLE 1

| | Type of Processing Gas | Complementary Gas/Processing Gas Flow Rate Ratio | Complementary Gas Injection Angle | Abrasion Resistance | Haze % | Non-Uniformity of Film Surface |
|---|---|---|---|---|---|---|
| Example 1 | 1 | 1 | 45 | A | 0.2 | A |
| Example 2 | 1 | 0.5 | 45 | B | 0.3 | B |
| Example 3 | 1 | 2 | 45 | A | 0.3 | A |
| Example 4 | 1 | 4 | 45 | B | 0.3 | B |
| Example 5 | 1 | 6 | 45 | B | 0.2 | B |
| Example 6 | 2 | 1 | 45 | A | 0.2 | A |
| Example 7 | 2 | 1 | 10 | A | 0.2 | A |
| Example 8 | 2 | 1 | 90 | A | 0.3 | A |
| Example 9 | 2 | 1 | 110 | B | 0.3 | B |
| Example 10 | 2 | 4 | 110 | B | 0.2 | B |
| Example 11 | 2 | 6 | 150 | B | 0.4 | B |
| Comp. 12 | 1 | no complementary gas | — | C | 0.5 | C |
| Comp. 13 | 2 | no complementary gas | — | C | 1.2 | D |

Comp.: Comparative Example
1) When the complementary gas is absent (Comparative Examples 12 and 13), abrasion resistance is significantly deteriorated.
2) The flow rate of the complementary gas is equal to or higher than the processing gas. However, when they are almost identical, non-uniformity of the film surface is improved (Examples 1, 2, 6, 7, and 8).
3) θ [complementary gas injection angle] is preferably at most 90° (comparison between Examples 8 and 9), and is most preferably at most 45°.

The invention claimed is:

1. A thin film forming apparatus in which a thin film is formed on a surface of a continuously Conveyed substrate via plasma discharge processing at or near atmospheric pressure, wherein the thin film forming apparatus comprises:
  a pair of rotating roller electrodes which face each other beyond a specified gap,
  a plasma discharge device which applies voltage to the pair of roller electrodes to generate plasma discharge,
  a conveying device which conveys the substrate to the plasma discharge device,
  a processing gas blowing device having an apex pointed in a direction of the specific gap and two concave side walls, one of each of the concave side walls opposing respectively one of each of the pair of rotating roller electrodes,
  a processing gas blowing exit section in the apex through which a processing gas blows at or near atmospheric pressure in the direction of the specified gap,
  a complementary gas blowing exit section in each one of the two concave side walls and through which complementary gas containing an inert gas blows in a direction of the respective one of the pair of rotating roller electrodes, respectively,
  a gas exhaust device which exhausts the processing gas and the complementary gas which have passed the pair of rotating roller electrodes, and
  an angle θ measured from the direction of the specific gap to the direction of the respective one of the pair of rotating roller electrodes is no less than 10° and no more than 90°.

2. The thin film forming apparatus of claim 1, wherein the processing gas contains at least 90% by volume of an inert gas, and oxygen or hydrogen.

3. The thin film forming apparatus of claim 1, wherein the inert gas is a rare gas or nitrogen.

4. The thin film forming apparatus of claim 1, wherein a surface of one of the pair of roller electrodes is covered with a solid dielectric.

5. The thin film forming apparatus of claim 1, wherein a distance between each of the complementary gas blowing exit section and a surface of the paired roller electrodes is 0.5-20 mm.

6. The thin film forming apparatus of claim 1, wherein a distance of the specified gap is 0.5-20 mm.

7. The thin film forming apparatus of claim 1, wherein a frequency of a power source which applies voltage to the pair of roller electrodes is more than 80 kHz and not more than 150 MHz.

8. The thin film forming apparatus of claim 1, wherein the pair of roller electrodes, the plasma discharge device, the conveying device, the processing gas blowing device, and the gas exhaust device are incorporated within one processing chamber.

9. The thin film forming apparatus of claim 1, wherein a flow rate of the complimentary gas during its blowing is at least the same as that of the processing gas during blowing from the blowing exit section of the processing gas blowing means to at most 2 times.

10. The thin film forming apparatus of claim 1, wherein the processing gas is composed of a discharge gas and a thin film forming gas.

11. The thin film forming apparatus of claim 10, wherein the discharge gas is an inert gas.

12. The thin film forming apparatus of claim 11, the thin film forming gas is composed of a raw material gas and a reaction gas.

13. The thin film forming apparatus of claim 1, wherein the complementary gas is composed on an inert gas, or an inert gas and a reaction gas.

14. The thin film forming apparatus of claim 1, wherein
   the processing gas is composed of a discharge gas and a thin film forming gas comprising a raw material gas and a reaction gas, and
   the complementary gas is composed of the same components as the discharge gas, or the discharge gas and the reaction gas, of the processing gas.

15. The thin film forming apparatus of claim 1, wherein the processing gas blowing device contains two complementary gas blowing exit sections and one processing gas blowing exit section provided between the two complementary gas blowing exit section.

* * * * *